United States Patent [19]

Gulczynski

[11] Patent Number: 4,714,894

[45] Date of Patent: Dec. 22, 1987

[54] OPERATIONAL AMPLIFIER

[76] Inventor: Zdzislaw Gulczynski, 19 Greenhalge St., Medford, Mass. 02155

[21] Appl. No.: 843,165

[22] Filed: Mar. 24, 1986

[30] Foreign Application Priority Data

Mar. 25, 1985 [DE] Fed. Rep. of Germany ....... 3510729

[51] Int. Cl.⁴ .............................................. H03F 3/45
[52] U.S. Cl. .................................... 330/260; 330/253; 330/255; 330/257
[58] Field of Search ............... 330/253, 255, 257, 260, 330/311

[56] References Cited

U.S. PATENT DOCUMENTS 4,059,808  11/1977  Sakamoto et al. .................. 330/257
4,453,092   6/1984  Joseph ............................. 330/257 X

FOREIGN PATENT DOCUMENTS 3142607  5/1983  Fed. Rep. of Germany ...... 330/257

Primary Examiner—James B. Mullins

[57] ABSTRACT

The invention relates to an operational amplifier (OA) particularly for signal amplification requiring wide bandwidth, high slew rate, and fast settling time. The OA contains two voltage followers rather than differential amplifier in the first stage. The OA has very low number of the components, especially resistors. The common base as the operation mode of the transistors is favored in order to achieve a very high and fastest possible signal amplification. The OA provides a pair of emitter followers having outputs coupled across the base and emitter of a transistor and an amplifier coupled to supply a current to the base of the transistor in response to the collector current thereof.

5 Claims, 4 Drawing Figures

OPERATIONAL AMPLIFIER

BACKGROUND AND SUMMARY OF THE INVENTION

The invention relates to an operational amplifier (OA) particularly for signal amplification requiring wide bandwidth, high slew rate, and fast settling time.

Two parts can generally be distinguished in every OA: the input and the output stage. In the input stage the differential input signal of the OA is amplified and converted into a single signal. An additional amplification is accomplished in the output stage which also provides low output impedance, short circuit protection, etc.

Two transistors as voltage followers are used in the first stage of the OA in order to avoid the disadvantages of a differential amplifier, e.g. the high output impedance, or in that way enforced circuit concepts having just a moderate performance. The output currents of the voltage followers flow to a current mirror via a current follower each. The output of the input stage consists thus of a current source controlled by the differential input voltage of the OA. A good example of this common solution is the input stage of the very popular OA: uA 741.

A relatively high offset voltage is caused by an insufficient performance of the current mirror. The input impedance of the output stage must be high. The large number of the components and the specific operation mode of the individual transistors results in a slow signal amplification. This input stage is suitable only for monolithic integrated circuits.

The invention is intended to provide an OA having very low number of components and providing fast and high signal amplification. According to the invention an operational amplifier with two voltage followers and without differential amplifier in the first stage solves this problem, as outlined in claim 1.

The differential input signal is converted into the single signal in the easiest way. Furthermore, the common base as the operation mode of the transistors is favored in order to achieve a very high and fastest possible signal amplification. Another advantage is the output impedance of the input stage which can be very low.

BRIEF DESCRIPTION OF THE DRAWINGS

The present invention will become more clear in conjunction with the accompanying figures of which.

DETAILED DESCRIPTION OF THE INVENTION

Figure 1:
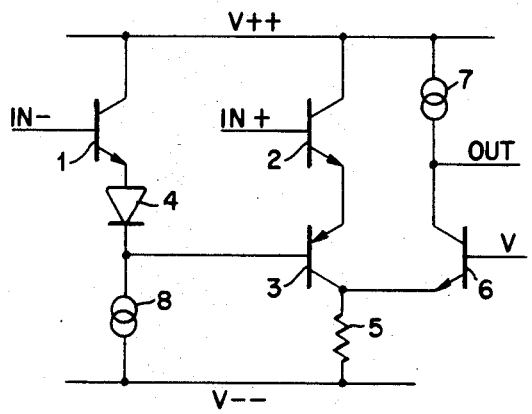
FIG. 1 is an embodiment of the prior art.

The differential input signal of the OA is applied to the bases of the transistors 1 and 2 which work as voltage followers, as shown in FIG. 1. Their emitters are connected respectively to the base of the transistor 3 via the conducting diode 4 and to the emitter of the transistor 3 directly. The output signal of the input stage appears across the resistor 5 which is connected between the collector of the transistor 3 and the supply voltage source V − −. The output stage comprises the transistor 6, which works in base mode and collector of which is connected to the supply voltage source V + + via the current source 7, and to the output terminal of the OA.

The diode 4 reduces the offset voltage of the OA. A transistor matched with the transistor 3 can be used as the diode 4.

The employment of the current source 8 is very beneficial. The offset voltage and its temperature drift can be adjusted separately. The offset voltage can also be adjusted as usual, e.g. employing a resistor in series with the emitter of the transistor 1 and/or 2. At least one of these transistors can be replaced by short circuit if a low input impedance is acceptable. The collector or emitter currents of the transistors 2 and 3 depend essentially on the fixed voltage V and the resistor 5.

Figure 2:
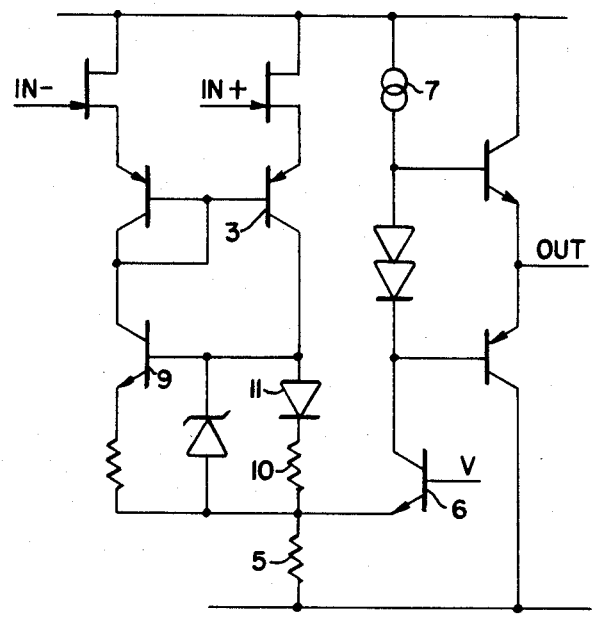
FIG. 2 is an embodiment of the present invention with a circuit for compensation of the collector of drain currents of the input transistors of the OA, and a standard end stage.

Two FET's are employed as voltage followers, as shown in FIG. 2, whereby the input impedance of the OA is very high. The circuit contains also a common push-pull end stage. The transistor 9 samples the voltage drop across the resistor 10 and the diode 11 caused by collector current of the transistor 3. If the values of the resistor 10 and the emitter resistor of the transistor 9 are equal then the corresponding collector or drain currents are nearly equal. Thermal properties of one of the resistors or the resistor 5 can contribute to reduction of the temperature dependence of the offset voltage of the OA. If necessary, the resistor 10 and the diode 11 can be bridged by a zener diode which limits the currents.

The transistor 9 sets up a positive feedback. The OA shows a higher gain.

The circuit can be further expanded. The employment of the differential amplifier instead of the transistor 6, emitter of which is connected to resistor 5, results in higher gain and higher input impedance of the output stage. The voltage drop across the resistor 5 is determined by the reference voltage of the differential amplifier.

Figure 3:
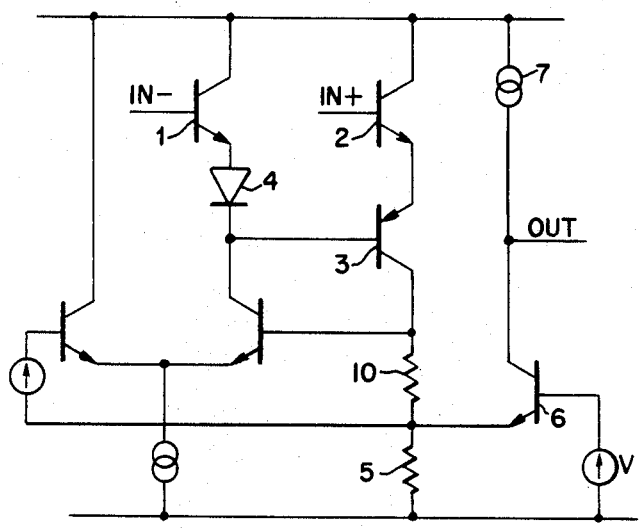
FIG. 3 is another embodiment of the present invention with a differential amplifier substituted for transistor 9 of FIG. 2.

The employment of the differential amplifier instead of the transistor 9, as shown in FIG. 3, results in a much higher accuracy with which the collector or drain currents of the input transistors of the OA are determined. The base of one of the transistors of the differential amplifier can be connected to one of the terminals of the resistor 10 and its collector to the base of the transistor 3. A voltage source is connected between the paired transistor of the differential amplifier and one of the terminals of the resistor 5. The diode 11 is needless.

Figure 4:
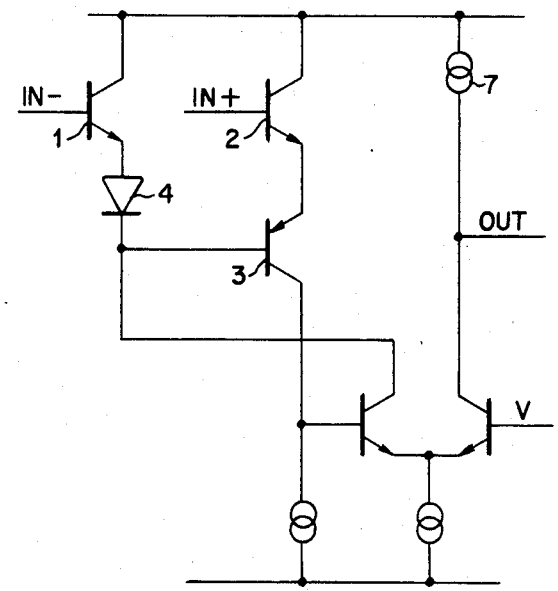
FIG. 4 is another embodiment of the present invention with a differential amplifier substituted for transistors 6 and 9 of FIG. 2.

The effect of the two differential amplifiers can be achieved by just one differential amplifier, as shown in FIG. 4. The bases of the transistors employed in the differential amplifier can be connected respectively to the resistor 5 and a voltage source. The collectors of the transistors are connected respectively to base of the transistor 3 and the current source 7.

The resistor 5 can be replaced by a current source as shown in FIG. 4; this results in a much higher gain of the OA.

In contrast to a OA, the instrumentation amplifiers show an exactly determined gain, usually set by one resistor. They are exceptionally slow as a result of a very complex configuration.

An emmitter resistor of the transistor 3 will cause a voltage drop so that the collector current of the transistor 3 and, in conclusion, the voltage across the resistor 5 are proportional to the differential input voltage of the OA. The instrumentation amplifier, created in that way, can work properly only when the voltage applied to the input In+ is higher than the voltage applied to the input In−. However, an employment of a resistor in series with the diode 4 initiates a positive portion in the output voltage of the input stage of the OA. The offset voltage can be reduced, e.g. through an adjustment of the appropriate collector or drain currents.

It shall be explicitly pointed out that the output voltage of the input stage inherently depends on the differential input voltage.

What I claim is:

1. Operational amplifier for amplifying a signal applied to signal input terminals thereof, comprising:
    two voltage followers providing equally polarized unidirectional output currents, each voltage follower having an input and an output terminal, and exhibiting an input offset voltage and an output impedance;
    the signal input terminals being connected to the input terminals of the voltage followers;
    a transistor having base, emitter and collector;
    the output terminals of the voltage followers being connected across the base and the emitter of the transistor;
    a current source exhibiting an output impedance and being coupled to the collector of the transistor;
    a first amplifying means having an input and an output terminal and exhibiting an input offset voltage, for amplifying a voltage applied to the input terminal thereof;
    the input terminal of the first amplifying means being connected to the collector of the transistor;
    the output terminal of the first amplifying means providing an output signal of the operational amplifier; and
    a second amplifying means exhibiting an input offset voltage and being connected to the collector and the base of the transistor, for amplifying the collector voltage thereof and providing a current to the base thereof.

2. Operational amplifier of claim 1 further including a sampling means interposed between the current source and the collector of the transistor for sampling the collector current thereof; and
    wherein the second amplifying means includes a differential amplifying means having a pair of input terminals and an output terminal and exhibiting an input offset voltage, for amplifying the signal applied to the input terminals thereof;
    the input terminals of the differential amplifying means being connected to the sampling means;
    the output terminal of the differential amplifying means being connected to the base of the transistor and providing a current thereto.

3. Operational amplifier of claim 1 further including a sampling means comprising a diode and resistor connected in series between the current source and the collector of the first said transistor for sampling the collector current thereof, and further wherein the second amplifying means includes a second transistor having a base and collector connected respectively to the collector and base of the first said transistor, and an emitter coupled to the current source.

4. Operational amplifier of claim 3 further including a Zener diode connected in parallel with the diode and resistor.

5. Operational amplifier for amplifying a signal applied to signal input terminals thereof, comprising:
    two voltage followers providing equally polarized unidirectional output currents, each voltage follower having an input and an output terminal, and exhibiting an input offset voltage and an output impedance;
    the signal input terminals being connected to the input terminals of the voltage followers;
    a transistor having base, emitter and collector;
    the output terminals of the voltage followers being connected across the base and the emitter of the transistor;
    a current source exhibiting an output impedance and being coupled to the collector of the transistor; and
    a differential amplifying means exhibiting an input offset voltage and being connected to the collector of the transistor for amplifying the collector voltage thereof, a first output being connected to the base of the transistor for providing a current thereto, and a second output for providing an output signal of the operational amplifier.

* * * * *